United States Patent [19]

Baird

[11] Patent Number: 4,910,581

[45] Date of Patent: Mar. 20, 1990

[54] INTERNALLY MOLDED ISOLATED PACKAGE

[75] Inventor: John Baird, Scottsdale, Ariz.

[73] Assignee: Motorola, Inc., Schaumburg, Ill.

[21] Appl. No.: 290,658

[22] Filed: Dec. 27, 1988

[51] Int. Cl.⁴ .......................................... H01L 23/28
[52] U.S. Cl. .......................................... 357/72; 357/81
[58] Field of Search ................................. 357/81, 72

[56] References Cited

U.S. PATENT DOCUMENTS

| | | | |
|---|---|---|---|
| 4,637,130 | 1/1987 | Fujii et al. | 437/217 |
| 4,642,716 | 2/1987 | Wakabayashi et al. | 357/81 |
| 4,750,030 | 6/1988 | Hatakeyama | 357/81 |
| 4,769,344 | 9/1988 | Sakai et al. | 357/74 |

*Primary Examiner*—James W. Davie
*Attorney, Agent, or Firm*—Joe E. Barbee

[57] ABSTRACT

A semiconductor package having an internally isolated die flag form an externally exposed heatsink is provided by using a two stage molding process. The first molding stage provides a uniform layer of molding material of a predetermined thickness between a die flag area and a heatsink area. A second stage molding procedure then provides the packaging encapsulation thereby establishing the outer dimensions.

10 Claims, 1 Drawing Sheet

INTERNALLY MOLDED ISOLATED PACKAGE

BACKGROUND OF THE INVENTION

This invention relates, in general, to semiconductor packages, and more particularly, to a semiconductor package having internally molded isolation.

Some semiconductor packages which are required to dissipate a considerable amount of heat have an exposed heatsink area. Typically, a semiconductor device is mounted on a flag area of a leadframe. The flag area also serves as a heatsink which is partially exposed. However, some semiconductor circuits enclosed in such packages need to be electrically isolated from the heatsink. In some cases where it was necessary to electrically isolate the semiconductor device from any exposed heatsink portion the entire flag area which included the heatsink portion was encapsulated to ensure electrical isolation of the flag area. This resulted in the overall package being larger in size than a standard package and required careful control of the thickness of the encapsulating material around the heatsink portion in order to continue to maintain sufficient thermal conductivity between the heatsink and an external heat exchanger. Another approach to providing the electrical isolation was to make the heatsink separate from the flag area and then place an insulator, such as ceramic, between the flag area and the heatsink. The overall structure was then encapsulated leaving a portion of the heatsink exposed for mounting to a heat exchanger. However, this arrangement is difficult to assemble.

Accordingly, it is an object of the present invention to provide an improved semiconductor package having internally molded isolation.

Another object of the present invention is to provide an internally isolated semiconductor package made by a two stage molding process.

Yet another object of the present invention is to provide a semiconductor package having internally molded isolation with exactly the same external package dimensions as a standard package.

SUMMARY OF THE INVENTION

The above and other objects and advantages of the present invention are provided by a two stage molding process wherein the first stage molds an electrical isolation layer between a die flag area and a heatsink. The second stage molding process then over molds the entire assembly leaving a portion of the heatsink exposed so that the resulting semiconductor package has the same outer dimensions as a standard package.

DETAILED DESCRIPTION OF THE DRAWINGS

Figure 1:
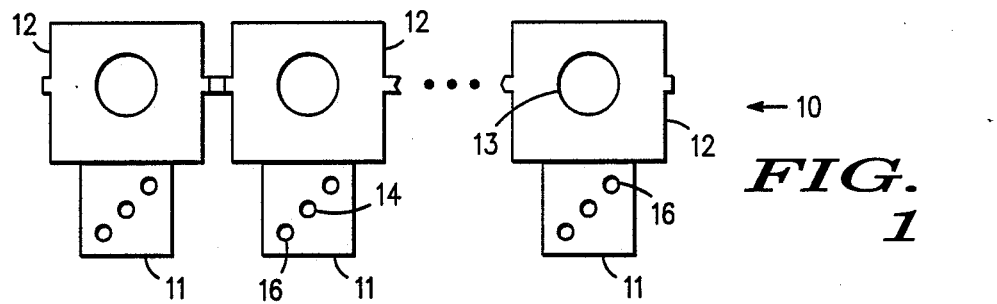
FIG. 1 illustrates a heatsink frame useful in the present invention.

FIG. 1 illustrates a portion of a heatsink frame 10. Heatsink frame 10 typically has a plurality of separable elements each having a heatsink area 11 and a mounting area 12. Mounting area 12 has a mounting hole 13. Mounting hole 13 can be used to attach an assembled package to a heat exchanger. Heatsink portion 11 has a center hole 14 which is used as a molding gate in a first stage molding process, and one or more gripping holes 16. As illustrated in FIG. 1 heatsink area 11 has two gripping holes 16. During the first stage molding process molding material will enter opening 16 to increase the gripping force of the molding material to heatsink area 11.

Figure 2:
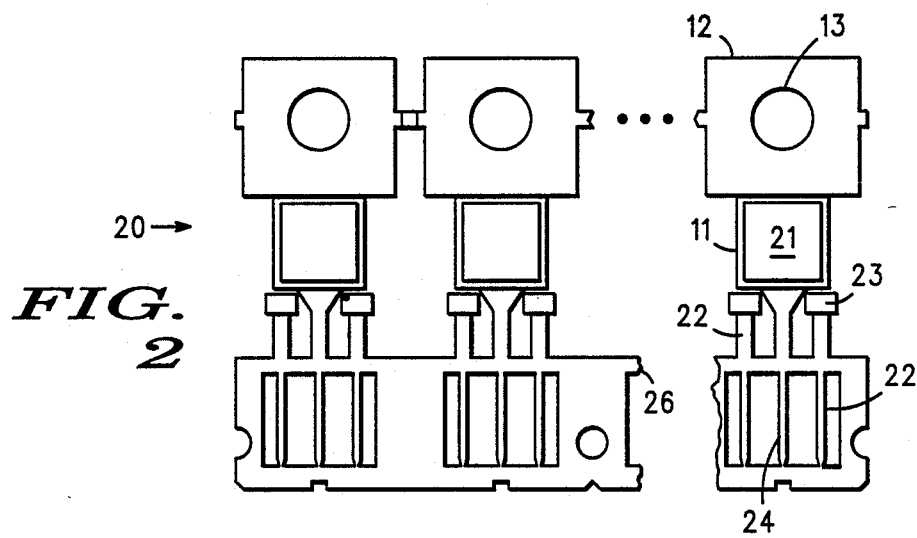
FIG. 2 illustrates a leadframe of the present invention attached to the heatsink frame of FIG. 1.

FIG. 2 illustrates a leadframe 20 which has already been mated or attached to heatsink frame 10. Leadframe 20 has a plurality of separable die flag areas 21. Each die flag area 21 has a plurality of pins or leads 22 and 24. As illustrated in FIG. 2 leads 22 are the two outside leads associated with a die flag area 21 while lead 24 is a center lead which is physically attached to die flag 21. Leads 22 and 24 are held together by a tie bar 26. Leads 22 terminate near die flag 21 in a bonding pad area 23. Typically die flag 21 is a mounting surface for a semiconductor device. Thin wires are then used to make electrical connections between the semiconductor device and bonding pads 23.

Figure 3:
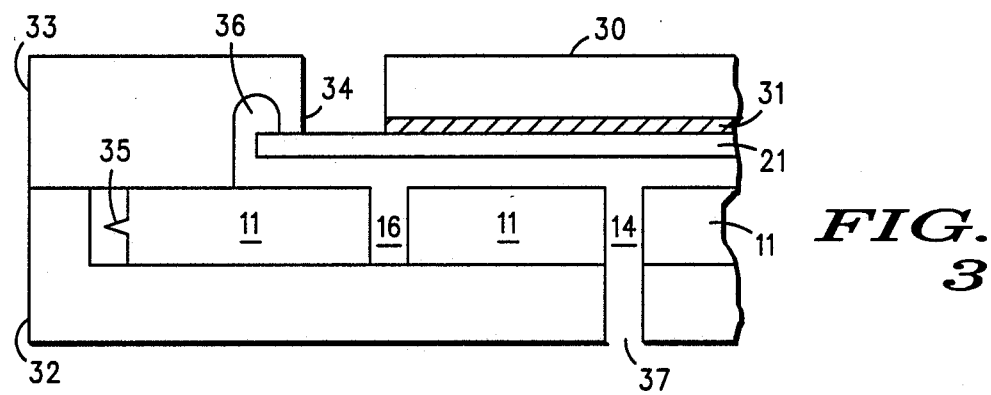
FIG. 3 illustrates an enlarged view of a cross-sectional portion of a mold used to provide the assembly of FIG. 2.

FIG. 3 is a cross-sectional view of a portion of a mold used in a first stage molding process and enclosing die flag 21 and heatsink area 11. The mold has a first half 32 and a second or top half 33. FIG. 3 is an enlarged view showing a portion of heatsink 11 having center hole 14, which serves as a mold gate, and one gripping hole 16. Also illustrated for sake of completeness is a gripping tab 35 provided on the edge of heatsink area 11. Gripping tab 35 plays no functional part in the first stage molding process but serves to grip the encapsulating material which is applied during the second stage molding process. Above heatsink area 11 is die flag 21 which is illustrated as having a semiconductor device 30 attached by a suitable attaching material 31. Material 31 is an epoxy, a solder, or the like. Upper mold half 33 closes around the periphery of heatsink 11 and has a foot 34 which closes on die flag 21. Foot 34 forms a cavity 36 with the main body of upper mold half 33. Lower mold half 32 has a recess to accommodate heatsink 11. Mold gate 14 of heatsink 11 aligns with an opening or runner 37 located in lower mold half 32.

Runner 37 carries the molding or encapsulating material to gate 14. As the molding compound enters gate 14 it forces die flag 21 against foot 34 thereby creating an insulation distance between die flag 21 and heatsink 11. The molding compound travels along the upper surface of heatsink 11, enters opening 16, and continues to cavity 36. The portion of molding material that enters opening 16 provides gripping force between the molding material and heatsink 11. The molding compound will also enter cavity 36 thereby enclosing the edge of die flag 21 to form a "picture frame" around die flag 21. Foot 34 surrounds three edges of die flag 21 while the fourth edge of die flag 21 located near leads 22 and 24 is sealed by an edge engagement using a support pin near the leads. The supported fourth edge of die flag 21 limits the pressure useable for the injection of material for the isolation layer formed in the arrangement of FIG. 3.

In a preferred embodiment, the molding material used as an electrical isolation layer between heatsink 11 and die flag 21 is a thermoplastic poly-aromatic compound such as poly ether sulphone (PES). One such poly ether sulphone material is 'Victrex' PES (victrex is a registered trademark of Imperial Chemical Industries PLC) which is available from ICI Advanced Materials Business Group, Wilmington, Delaware. Any high temperature engineering thermoplastic material would be suitable for molding the isolation layer. Such a material provides bleed free molding and does not require post mold curing since the material is fast setting. Foot 34 helps establish the thickness of the molding compound between heatsink 11 and die flag 21 since it serves to establish the distance that the molding compound can lift or push flag area 21 away from heatsink 11. The thickness of the molding compound should be at least 50 micrometers thick but may go up to 250 micrometers thick for safety factor. The thickness establishes high voltage isolation between between heatsink 11 and die flag 21 and can be adjusted to meet a desired requirement. The thermal conductivity of the molding compound can be increased by adding fillers to the thermoplastic material. Up to thirty percent filler may be added.

The first stage molding joins heatsink 11 to die flag 21 as illustrated in FIG. 3. The second stage molding is an over-molding step which encapsulates the sides of heatsink 11 including gripping tab 35 and also encloses die flag 21 and semiconductor device 30. The bottom of heatsink 11 is typically left exposed. The dimensions of the package after the second over-molding step is the same as for an industry standard package. As illustrated in the figures, a TO-220 type package is illustrated. However, it will be appreciated that this invention is applicable to TO-220, TO-218, and the like type packages. TO-220 and TO-218 are registered by JEDEC and are industry standards. The second stage molding is not illustrated since the second stage molding can be done in accordance with common molding practices. However, it will be appreciated that there is a definite advantage in using the same thermoplastic material for the second stage molding as is used for the first stage molding. This would result in maximum utilization of materials and since thermoplastic materials are quick setting no post mold cure is necessary.

If the solder or adhesive material 31 used to attach semiconductor device 30 to die flag 21 can withstand die bonding, wire bonding, and die coat temperatures then it is possible to perform the first stage molding, which joins heatsink 11 to die flag 21, prior to the attachment of semiconductor device 30 to die flag 21. If this can be done then the design of the mold used in the first stage molding can be simplified since it would close on all four edges of die flag 21. It will also be noted that an advantage in gripping power will result if holes 16 in heatsink portion 11 are punched from top to bottom. This will result in the opening of hold 16 being smaller at the top than at the bottom and will also relegate any resulting burrs to the bottom side of heatsink 11 to avoid potential shorting problems between heatsink 11 and die flag 21.

Figure 4:
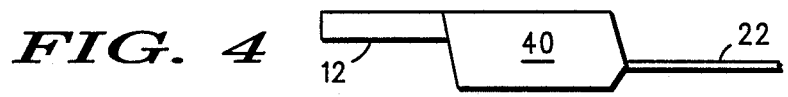
FIG. 4 is a side view of a resulting semiconductor package of the present invention.

FIG. 4 illustrates a side view of a semiconductor package incorporating the present invention. Mounting portion 12 extends beyond second stage molded encapsulating material 40. Extending from a side opposite from mounting portion 12 are leads 22. The overall size and dimensions of the completed package are the same as for an industry standard package. As illustrated in FIG. 4 tie bar 26 as well as indexing rails of leadframe 20 have been removed.

By now it should be appreciated that there has been provided an internally molded isolated semiconductor package wherein a die flag area is electrically isolated from the heatsink area. The isolating distance is maintained in a manner t provide adequate electrical isolation but yet to not overly degrade the thermal conductivity. This results in a semiconductor package being internally isolated from an externally exposed heatsink in exactly the same package dimensions as a standard package.

What is claimed:

1. An internally molded isolated semiconductor package comprising: a heatsink having an opening which serves as a mold gate; a leadframe having an area for receiving a semiconductor device and a plurality of leads positioned adjacent to the area for receiving the semiconductor device; a thin layer of molding compound positioned between the heatsink and the area for receiving the semiconductor device to hold the heatsink and the area together while maintaining electrical isolation and thermal contact, wherein the thin layer is inserted through the opening of the heatsink; and encapsulating material enclosing a portion of the leadframe and a portion of the heatsink.

2. The isolated semiconductor package of claim 1 wherein the heatsink has at least one additional hole for receiving a portion of the thin layer of molding compound in order to provide gripping of the molding compound.

3. The isolated semiconductor package of claim 1 wherein the molding compound is a thermoplastic.

4. An internally isolated semiconductor package which is assembled as follows: providing a heatsink having an opening which serves as a mold gate; providing a leadframe having a flag area for receiving a semiconductor device and having a plurality of leads adjacent the flag area; positioning the heatsink and the leadframe within a mold cavity and closing the mold; injecting a molding compound into the cavity through the opening in the heatsink, wherein the molding compound pushes the heatsink and leadframe apart to provide a thin layer of molding compound therebetween to provide electrical isolation of the heatsink from the leadframe; removing the leadframe which is moldably attached to the heatsink from the mold cavity; mounting and attaching a semiconductor device to the leadframe; placing the leadframe and attachments in another mold cavity; and encapsulating the semiconductor device and a portion of the leadframe while leaving a surface of the heatsink unencapsulated.

5. The semiconductor package of claim 4 wherein the molding compound is a thermoplastic.

6. An internally isolated semiconductor package comprising: a heatsink having a first and a second surface, and having a hole extending from the first to the second surface; a leadframe having a plurality of pins adjacent to a flag area for receiving a semiconductor die; a thin layer of molding compound for fixedly holding the flag area of the leadframe to the first surface of the heatsink, the molding compound being applied through the hole in the heatsink; and an encapsulating compound for encapsulating a portion of the leadframe pins, the semiconductor die, and a portion of the heatsink, wherein the second surface of the heatsink is exposed.

7. The isolated semiconductor package of claim 6 wherein the encapsulated portion, the pins and the heatsink form a TO-220 package.

8. The isolated semiconductor package of claim 6 wherein the thin layer of molding compound extends up over at least three edges of the flag area to better grip the flag area.

9. The isolated semiconductor package of claim 6 wherein the heatsink has an extended portion for attaching the semiconductor package to a heat exchanger.

10. An internally isolated semiconductor package having a die flag area isolated from a heatsink, comprising: a molding compound provided by a first stage molding to electrically isolate the die flag area from the heatsink; and an encapsulating material surrounding, the die flag area and at least a portion of the heatsink to provide a semiconductor package having predetermined outer dimensions.

* * * * *